United States Patent
Chung et al.

(10) Patent No.: US 9,190,278 B2
(45) Date of Patent: Nov. 17, 2015

(54) DEVICE AND METHOD FOR IMPROVING CRYSTALLIZATION

(71) Applicant: EverDisplay Optronics (Shanghai) Limited, Shanghai (CN)

(72) Inventors: ShangHua Chung, Shanghai (CN); YuChun Yeh, Shanghai (CN)

(73) Assignee: EVERDISPLAY OPTRONICS (SHANGHAI) LIMITED, Shanghai (CN)

(*) Notice: Subject to any disclaimer, the term of this patent is extended or adjusted under 35 U.S.C. 154(b) by 30 days.

(21) Appl. No.: 14/094,435

(22) Filed: Dec. 2, 2013

(65) Prior Publication Data
US 2014/0308803 A1    Oct. 16, 2014

(30) Foreign Application Priority Data
Apr. 12, 2013   (CN) .......................... 2013 1 0128323

(51) Int. Cl.
| | |
|---|---|
| *H01L 21/3205* | (2006.01) |
| *H01L 21/268* | (2006.01) |
| *B23K 26/06* | (2014.01) |
| *H01L 21/02* | (2006.01) |

(52) U.S. Cl.
CPC ............ *H01L 21/268* (2013.01); *B23K 26/063* (2013.01); *B23K 26/0604* (2013.01); *B23K 26/0608* (2013.01); *H01L 21/02532* (2013.01); *H01L 21/02686* (2013.01); *H01L 21/02691* (2013.01)

(58) Field of Classification Search
None
See application file for complete search history.

(56) References Cited

U.S. PATENT DOCUMENTS

| | | | |
|---|---|---|---|
| 5,529,951 A | 6/1996 | Noguchi et al. | |
| 7,009,140 B2 | 3/2006 | Partio et al. | |
| 2001/0052513 A1* | 12/2001 | Tanabe ..................... | 219/121.86 |

FOREIGN PATENT DOCUMENTS

CN           1822334 A        8/2006

* cited by examiner

*Primary Examiner* — Angel Roman
(74) *Attorney, Agent, or Firm* — Andrew F. Young, Esq.; Lackenbach Siegel, LLP

(57) ABSTRACT

The invention discloses a method and a device of improving crystallization ratio of polysilicon, which is applied to the process that the amorphous silicon layer converts into the polysilicon layer. More specifically, superposing at least two pulse laser beams into a superposed pulse laser beam. The pulse width of the superposed pulse laser beam is larger than each pulse laser beam. Next, utilizing the superposed pulse laser beam to irradiate onto the amorphous silicon layer for transforming the amorphous silicon layer into polysilicon layer. The superposed pulse laser beam irradiates onto the surface of the amorphous silicon layer. The amorphous silicon layer is transformed into the polysilicon layer. Consequently, the crystallization ratio of polysilicon is improved.

16 Claims, 3 Drawing Sheets

DEVICE AND METHOD FOR IMPROVING CRYSTALLIZATION

CROSS-REFERENCE TO RELATED APPLICATIONS

The present application claims priority to and the benefit of Chinese Patent Application No. CN 201310128323.4, filed on Apr. 12, 2013, the entire content of which is incorporated herein by reference.

BACKGROUND OF THE INVENTION

1. Field of the Invention

The present disclosure relates to the technology of poly-silicon crystallization, more specifically, relates to a device and a method for improving crystallization ratio of polysilicon.

2. Description of the Related Art

Polysilicon is popular for the thin film transistor manufacturing, particularly for the thin film transistors drive liquid crystal display due to the better electrical characteristics thereof than that of amorphous silicon and to the lower cost thereof than that of monocrystalline silicon.

In related art, the excimer laser annealing is popularly applied to the poly-silicon thin film.

U.S. Pat. No. 5,529,951 discloses a method of forming a polycrystalline silicon thin film improved in crystallinity and a channel of a transistor superior in electrical characteristics by the use of such a polycrystalline silicon thin film. An amorphous silicon layer of a thickness preferably of 30 nm to 50 nm is formed on a substrate. Next, substrate hearting is performed to set the amorphous silicon layer to preferably 350° C. to 500° C., more preferably 350° C. to 450° C. Then, at least the amorphous silicon layer is irradiated with laser light of an excimer laser energy density of 100 mJ/cm$^2$ to 500 mJ/cm$^2$, preferably 280 mJ/cm$^2$ to 330 mJ/cm$^2$, and a pulse width of 80 ns to 200 ns, preferably 140 ns to 200 ns, so as to directly anneal the amorphous silicon layer and form a polycrystalline silicon think film. The total energy of the laser used for the irradiation of excimer laser light is at least 5 J, preferably at least 10 J. However, the temperature generated by energy of the laser energy can not reach the melting temperature. It is necessary to perform multiple times of excimer laser irradiation to transform the amorphous silicon into poly-silicon. When using a relatively big peak power laser to irradiate the surface, where peak power equals to the laser energy is divided by pulse width, the hydrogen explosion incurs easily, which makes polysilicon peeling off, impairs the crystallization ratio of polysilicon and pollutes the optical lens.

Chinese Patent No. CN 1822334A discloses a method of manufacture process of polysilicon thin film transistor. After the amorphous silicon layer is formed on the substrate, the amorphous silicon layer is patterned to formed silicon-based pattern to realize the preconfigured active area of the component. Next, a single-frequency long-pulse laser beam with pulse width from 100 nm to 200 nm is applied to prolong the heating time of the amorphous silicon. The melt crystallization of the amorphous silicon is prolonged to promote forming the crystalline grain. However, it does not solve the problem of the hydrogen explosion, in which the irradiation of a large peak power laser results. And it does not either solve the problem of the polysilicon peeling off impairing the crystallization ratio of polysilicon.

U.S. Pat. No. 7,009,140B2 has disclosed a high energy, high repetition rate workpiece surface heating method and apparatus comprise a pulsed XeF laser operating at or above 4000 Hz and producing a laser output light pulse beam at a center wavelength of about 351 nm; an optical system narrowing the laser output light pulse beam to less than 20 μm in a short axis of the laser output light pulse beam and expanding the laser output light pulse beam to form in a long axis of the beam a workpiece covering extent of the long axis; the optical system including a filed stop intermediate the laser and the workpiece; the workpiece comprising a layer to be heated; wherein the optical system focuses the laser output light pulse beam at a field stop with a magnification sufficient to maintain an intensity profile that has sufficiently steep sidewalls to allow the field stop to maintain a sufficiently steep beam profile at the workpiece without blocking the beam profile at too high an intensity level. The apparatus may also have a high average power in the laser output light pulse beam as delivered to the workpiece and a linebow correction mechanism in a short axis optical assembly. The linebow correction mechanism may comprise a plurality of weak cross cylinders. The system may comprise a catadioptric projection system. The linewidth due to laser diffraction and divergence may be less than geometric limitations. The system may project adjacent peaks of the nominal XeF spectrum to improve overall depth of focus through the separate center wavelengths of each respective adjacent peak having a different focal plane at the workpiece. The system may comprise a linebow is correction mechanism within a field stop optical assembly correcting linebow at the field stop plane and within a workpiece projection optical assembly correcting linebow at the work piece plane. However, the laser pulse width is relatively long in this patent. The laser energy is large, and the peak power of the laser in the above invention is relatively large. Consequently, the above invention did not solve the problems of the hydrogen explosion and the hydrogen explosion makes polysilicon peeling off to affects crystallization ratio of polysilicon.

SUMMARY OF THE INVENTION

An aspect of an embodiment of the present disclosure is directed toward a device for improving crystallization ratio of polysilicon capable of solving the problem of hydrogen explosion resulted by the irradiation of a large peak power laser and the problem of polysilicon peeling off to pollute the optical lens and improving the crystallization ratio of polysilicon.

Another aspect of an embodiment of the present invention is directed toward a method for improving crystallization ratio of polysilicon.

An embodiment of the present disclosure provides a method, which is applied to the process that the amorphous silicon layer transformed into the polysilicon layer, the amorphous silicon layer covers on the upper surface of the hard substrate, comprising: providing an amorphous silicon layer covered on a surface of the hard substrate; superposing at least two pulse laser beams into a superposed pulse laser beam; and utilizing the superposed pulse laser beam to irradiate onto the amorphous silicon layer for transforming the amorphous silicon layer into polysilicon layer; wherein, the pulse width of the superposed pulse laser beam is bigger than each of that of the each laser beam, and the value of the peak power of the pulse laser beam is lower than the preconfigured value.

The range of laser intensity of the superposed pulse laser beam is from 250 mJ/cm$^2$ to 320 mJ/cm$^2$. The range of pulse width of the superposed pulse laser beam is from 150 ns to 300 ns. The pulse interval of the superposed pulse laser beam is from 20 ns to 80 ns. Each pulse laser beam is generated by one or multiple excimer laser sources. The frequency of each of the pulse laser beam is same. The phase difference of two adjacent pulse laser beams is smaller than the pulse laser width of the pulse laser beam. The wavelength of each of the pulse laser beam is 308 nm. The pulse laser beam is xenon chlorine laser. One of the two adjacent the pulse laser beams is S polarized light, and the other one is P polarized light. The hard substrate is the glass substrate or the plastic substrate.

Another embodiment of the present disclosure provides a device, which is applied to the process that the amorphous silicon layer converts into the polysilicon layer, comprising: a condenser lens for focusing the laser beams irradiated onto it and forming a superposed pulse laser beam which is irradiates onto the upper surface of the amorphous silicon layer; at least two laser sources for generating the laser beams, each of the laser sources generating a laser beam; and a plurality of reflectors corresponding to etch laser source for reflecting the laser beam to the condenser lens; wherein, the condenser lens is located between the reflectors and the amorphous silicon layer.

The wavelength of the laser that each of the laser source generates is 308 nm. The laser is xenon chlorine laser. The transmitting frequency of the laser source is same. The pulse width of the superpose pulse laser beam is larger than each of the pulse laser beam. The peak power of each of the pulse laser beam is lower than the preconfigured value. One of the two adjacent the pulse laser beams is S polarized light, and the other one is P polarized light.

BRIEF DESCRIPTIONS OF THE DRAWINGS

The accompanying drawings, together with the specification, illustrate exemplary embodiments of the present disclosure, and, together with the description, serve to explain the principles of the present disclosure.

DETAILED DESCRIPTIONS

Hereinafter, certain exemplary embodiments according to the present disclosure will be described with reference to the accompanying drawings.

Figure 1:
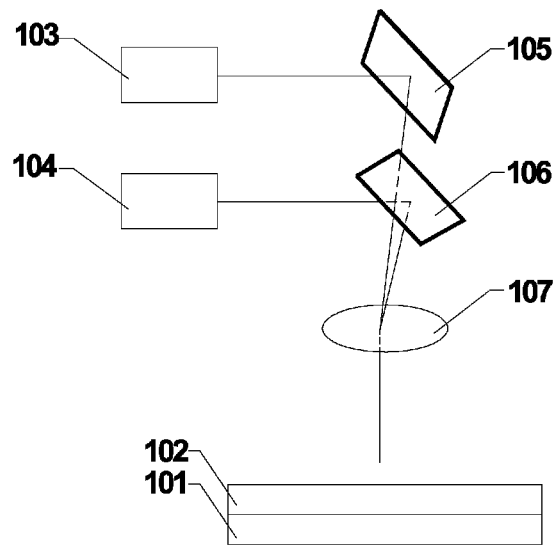
FIG. 1 shows a structure diagram of improving crystallization ratio of polysilicon by two excimer laser sources in Embodiment 1.

In Embodiment 1, FIG. 1 shows a structure diagram of improving crystallization ratio of polysilicon by two excimer laser sources in this embodiment. As shown in FIG. 1, Amorphous Silicon Layer 102 covers on Hard Substrate 101. First Excimer Laser Source 103 generates the first pulse laser beam onto First Reflector 105. Second Excimer Laser Source 104 generates the second pulse laser beam onto Second Reflector 106. The first pulse laser beam and the second pulse laser beam, which are reflected by First Reflector 105 and Second Reflector 106, superpose into a superposed pulse laser beam through Condensing Lens 107. The superposed pulse laser beam irradiates onto Amorphous Silicon Layer 102. Hence, the amorphous silicon layer converts into polysilicon layer.

The range of pulse width is from 150 ns to 300 ns, such as 150 ns, 200 ns, 230 ns, 260 ns or 300 ns, and so on. The range of laser intensity of the superposed pulse laser beam is from 250 mJ/cm$^2$ to 320 mJ/cm$^2$, such as 250 mJ/cm$^2$, 270 mJ/cm$^2$, 280 mJ/cm$^2$, 300 mJ/cm$^2$ or 320 mJ/cm$^2$, and so on. The pulse interval of the superposed pulse laser beam is from 20 ns to 80 ns, such as 20 ns, 40 ns, 55 ns, 60 ns or 80 ns, and so on. Moreover, the wavelength of the laser that each of the laser source generates is 308 nm, such as xenon chlorine laser. The laser-intensity of every pulsed laser beam is smaller than the laser beam induced by the single excimer laser source in the related art. The peak power of the first pulse laser beam and the second pulse laser beam is lower than the preconfigured value which is which is adopted by the peak power value of the single laser beam of hydrogen explosion in the related art. The hard substrate is, but without limitation to glass substrate.

The first pulse laser beam and the second pulse laser beam are made up of S polarized light or P polarized light, i.e., if one is made up of S polarized light, the other one is made up of P polarized light.

Figure 2:
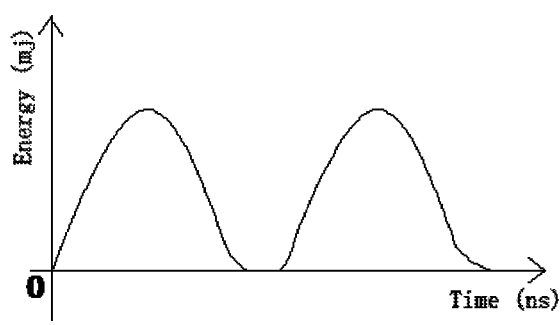
FIG. 2 shows a diagram of the relation between the laser energy generated by the excimer laser and the time in the related art.

FIG. 2 shows a diagram of the relation between the laser energy which the excimer laser generates in the related art and the time. The single excimer laser beam is applied to the process that the amorphous silicon layer converts into the polysilicon layer. As shown in FIG. 2, the horizontal axis is a time axis, namely the axis of pulse width, the vertical axis is an energy axis, namely the axis of laser energy. As the peak power equals to the laser energy divided by the pulse width, the pulse width of the single excimer laser beam is smaller, and the peak power of the single excimer laser beam is larger, which results in the hydrogen explosion easily.

Figure 3:
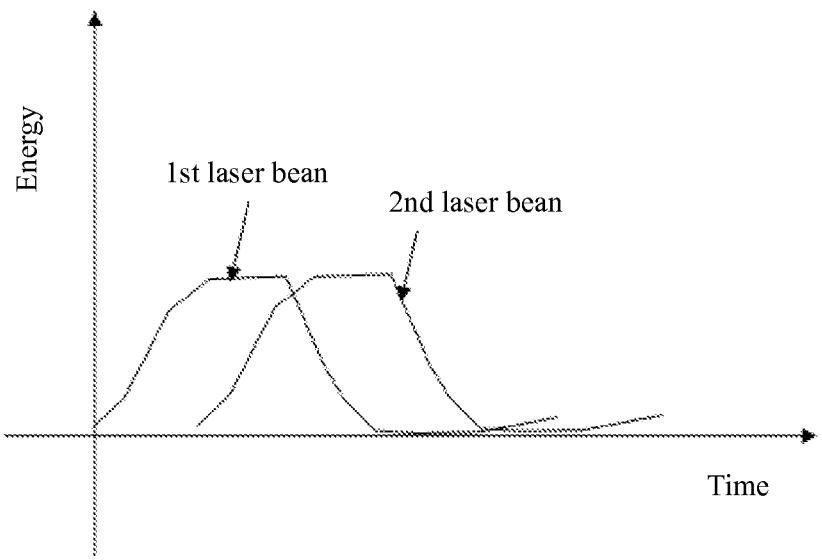
FIG. 3 shows a diagram of the relation between the laser energy of the first pulse laser and second pulse laser which two excimer laser sources generate in Embodiment 1 and the time.

FIG. 3 shows a diagram of the relation between the laser energy of the first pulse laser and second pulse laser generated by two excimer laser sources and the time. The horizontal axis is a time axis, namely the axis of pulse width. The vertical axis is an energy axis, namely the axis of the laser energy, controlling the interval time of the pulse laser beams which the first single excimer laser source and the second single excimer laser source generated superpose the pulse laser beams superpose into the superposed pulse laser beam. The pulse width of the superposed pulse laser beam is larger than the first pulse laser beam and the second pulse laser beam. The first pulse laser beam is made up of P polarized light, and the second laser beam is made up of S polarized light. Preferably, the peak power of the first pulse laser beam and the second pulse laser beam is lower than the preconfigured value in order to avoid the hydrogen explosion, which is adopted by the peak power value of the single laser beam of hydrogen explosion in the related art.

Figure 4:
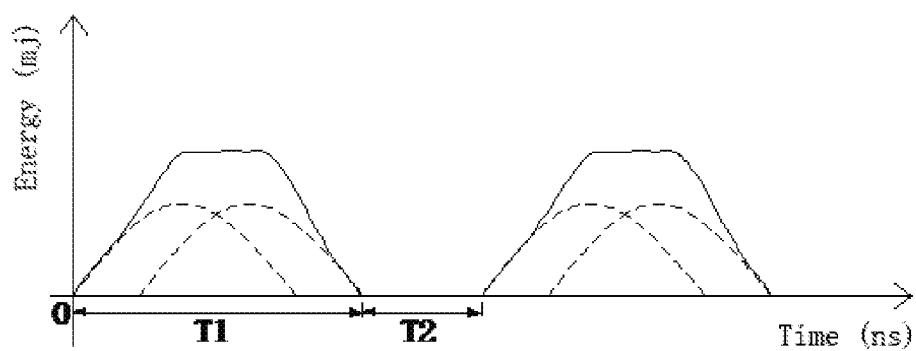
FIG. 4 shows a diagram of the relation between the laser energy which two excimer laser sources generate in Embodiment 1 and the time.

FIG. 4 shows a diagram of the relation between the laser energy which two excimer laser sources generate in and the time. The horizontal axis is a time axis, namely the axis of pulse width. The vertical axis is an energy axis, namely the axis of the laser energy. The full line waveform represents the energy of the superposed pulse laser beam, and the two waveform of imaginary line in the full line waveform represent the energy of the first pulse laser beam and the second pulse laser beam respectively. The range of Pulse Width T1 of the superposed pulse laser beam is from 150 ns to 300 ns, such as 150 ns, 165 ns, 195 ns, 235 ns, 265 ns or 300 ns, and so on. The pulse interval of the two superposed pulse laser beam is from 20 ns to 80 ns, such as 20 ns, 40 ns, 55 ns, 60 ns or 80 ns, and so on.

More specifically, two excimer laser sources generate lasers. The first pulse laser beam and the second pulse laser beam superpose into a superposed pulse laser beam through the reflector and the condensing lens. Due to the superposition of waves, when the first pulse laser beam generates earlier than the second one, which may be configured in the practical process, the pulse width of the superposed pulse laser beam irradiating onto the amorphous silicon layer is longer. The pulse width of the superposed pulse laser beam is larger than that of the each pulse laser beam.

Figure 5:
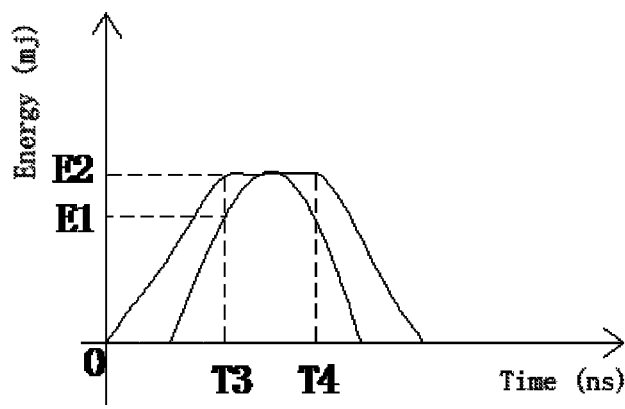
FIG. 5 shows a comparison diagram of FIGS. 2 and 4.

FIG. 5 shows a comparison diagram of FIGS. 2 and 4. The pulse width of the superposed pulse laser beam is larger than the single excimer pulse laser beam in related art. The wave crest for the energy of the superposed pulse laser beam is gentler than the laser beam in the related art. In addition, the energy of the superposed pulse laser beam in maintains at E2 level, which is the value of the wave crest. However, the energy of the laser beam which the single excimer laser source generates is range from E1 to E2, particularly for the time of T3 or T4. The energy of the laser which the laser source generates is E1, where the energy of the laser comparing with the wave crest reduces by the value of E2 minus E1. Hence, the wave crest for the energy of the superposed pulse laser beam is gentler than that of the laser beam in the related art.

Moreover, the energy of the superposed pulse laser beam is the same as the laser energy in the related art, which equals to the energy that amorphous silicon layer transformed into polysilicon layer. The peak power is equal to the laser energy divided by the pulse width. Furthermore, when the superposed pulse laser beam is applied to the transforming process of amorphous silicon layer into polysilicon layer, it overcomes the problem of hydrogen explosion which is resulted by the irradiation of a large peak power and the problem that the hydrogen explosion makes polysilicon peeling off to pollute the optical lens because the pulse width of the superposed pulse laser beam is larger than the single excimer laser beam in related art. Consequently, the crystallization ratio of polysilicon is improved.

Figure 6:
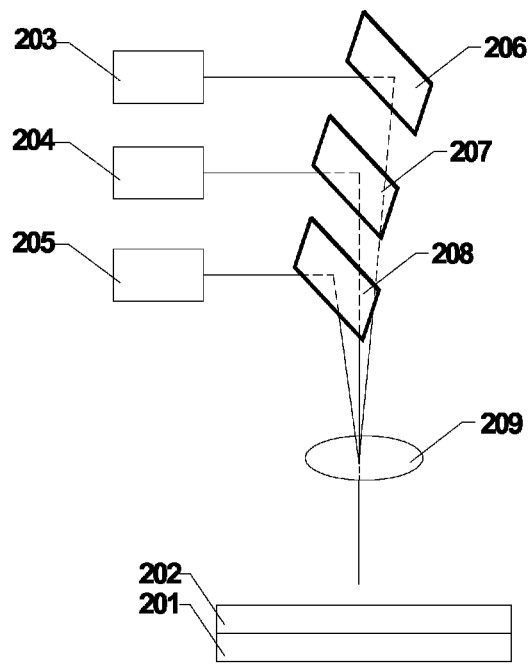
FIG. 6 shows a structure diagram of improving crystallization ratio of polysilicon by three excimer laser sources in Embodiment 2.

FIG. 6 shows a structure diagram of improving crystallization ratio of polysilicon by three excimer laser sources in Embodiment 2. FIG. 5 shows that Amorphous Silicon Layer 202 covers on Hard Substrate 201. First Excimer Laser Source 203 generates the first pulse laser beam onto First Reflector 206. Second Excimer Laser Source 204 generates the second pulse laser beam onto Second Reflector 207. Third Excimer Laser Source 205 generates the third pulse laser beam onto Third Reflector 208. The first, the second and the third pulse laser beams which are reflected respectively by First Reflector 206, Second Reflector 207 and Third Reflector 208 superpose into a superposed pulse laser beam through Condensing Lens 209. The superposed pulse laser beam irradiates onto Amorphous Silicon Layer 202, therefore, the amorphous silicon layer converts into polysilicon layer.

The range of pulse width of the superposed pulse laser beam through Condensing Lens 209 is from 150 ns to 300 ns, such as 150 ns, 175 ns, 215 ns, 250 ns or 300 ns, and so on. The range of laser intensity of the superposed pulse laser beam is from 250 mJ/cm$^2$ to 320 mJ/cm$^2$, such as 250 mJ/cm$^2$, 275 mJ/cm$^2$, 285 mJ/cm$^2$, 305 mJ/cm$^2$ or 320 mJ/cm$^2$, and so on. The pulse interval of the superposed pulse laser beam is from 20 ns to 80 ns, such as 20 ns, 35 ns, 45 ns, 65 ns or 80 ns, and so on. Moreover, the wavelength of the first pulse laser beam and the second pulse laser beam and is 308 nm, such as xenon chlorine laser. The hard substrate is, but without limitation to glass substrate.

Due to the superposition of waves, when the first pulse laser beam generates earlier than the second one, and the second one generates earlier than the third one, which may be configured in the practical process, the first, the second and the third pulse laser beams superpose into a superposed pulse laser beam through the high reflector and the condensing lens with a longer pulse width, larger than each of the pulse laser beam. The pulse width of the superposed pulse laser beam is larger than the single excimer laser beam in related art in Embodiment 2. Preferably, the energy of the superposed pulse laser beam is the same as the laser energy in the related art, and the peak power equal to the laser energy divided by the pulse width. When the superposed pulse laser beam superposed by three excimer laser source is applied to the process that amorphous silicon layer convert into polysilicon layer in Embodiment 2, it overcomes the problem of hydrogen explosion which is resulted by the irradiation of a large peak power and the problem that the hydrogen explosion makes polysilicon peeling off to pollute the optical lens because the pulse width of the superposed pulse laser beam is larger than the single excimer laser beam in related art. Consequently, the crystallization ratio of polysilicon is improved.

The laser beams are made up of P polarized light or is S polarized light. When the first pulse laser beam is made up of S polarized light, the second one is made up of P polarized light and the third pulse laser beam is made up of S polarized light. Likewise, when the first pulse laser beam is made up of P polarized light, the second pulse laser beam is made up of S polarized light and the third pulse laser beam is made up of P polarized light.

While the present disclosure has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What claimed is:

1. A method for improving crystallization ratio of polysilicon, comprising:
   providing an amorphous silicon layer covered on a surface of a hard substrate;
   superposing at least two pulse laser beams into a superposed pulse laser beam; and
   utilizing the superposed pulse laser beam to irradiate onto the amorphous silicon layer for transforming the amorphous silicon layer into polysilicon layer;
   wherein a pulse width of the superposed pulse laser beam is bigger than each of that of the each laser beam, and a value of a peak power of the pulse laser beam is lower than a preconfigured value.

2. The method as disclosed in claim 1, wherein the range of laser intensity of the superposed pulse laser beam is from 250 mJ/cm$^2$ to 320 mJ/cm$^2$.

3. The method as disclosed in claim 1, wherein the range of pulse width of the superposed pulse laser beam is from 150 ns to 300 ns.

4. The method as disclosed in claim 1, wherein the pulse interval of the superposed pulse laser beam is from 20 ns to 80 ns.

5. The method as disclosed in claim 1, wherein each pulse laser beam is generated by one or multiple excimer laser sources.

6. The method as disclosed in claim 1, wherein the frequency of each of the pulse laser beam is same.

7. The method as disclosed in claim 1, wherein the phase difference of two adjacent pulse laser beams is smaller than the pulse laser width of the pulse laser beam.

8. The method as disclosed in claim 1, wherein the wavelength of each of the pulse laser beam is 308 nm.

9. The method as disclosed in claim 1, wherein the pulse laser beam is xenon chlorine laser.

10. The method as disclosed in claim 1, wherein one of the two adjacent the pulse laser beams is S polarized light, and the other one is P polarized light.

11. The method as disclosed in claim 10, wherein the hard substrate is a glass substrate or a plastic substrate.

12. A device for improving crystallization ratio of polysilicon, comprising:

a condenser lens for focusing laser beams irradiated onto it and forming a superposed pulse laser beam to be irradiated onto an upper surface of a amorphous silicon layer;

at least two laser sources for generating the laser beams, each of the laser sources generating a laser beam; and a plurality of reflectors corresponding to etch laser source for reflecting the laser beam to the condenser lens;

wherein, the condenser lens is located between the reflectors and the amorphous silicon layer, a pulse width of the superposed pulse laser beam is bigger than each of that of the each laser beam, and a value of a peak power of the pulse laser beam is lower than a preconfigured value.

13. The device as disclosed in claim 12, wherein the wavelength of the laser that each of the laser source generates is 308 nm.

14. The device as disclosed in claim 12, wherein the laser is xenon chlorine laser.

15. The device as disclosed in claim 12, wherein the transmitting frequency of the laser source is same.

16. The device as disclosed in claim 12, wherein one of the two adjacent the pulse laser beams is S polarized light, and the other one is P polarized light.

* * * * *